(12) United States Patent
Katsumata et al.

(10) Patent No.: US 11,681,181 B2
(45) Date of Patent: Jun. 20, 2023

(54) BACKLIGHT DEVICE

(71) Applicant: NICHIA CORPORATION, Anan (JP)

(72) Inventors: Toshinobu Katsumata, Fujiyoshida (JP); Takumi Miyashita, Fujiyoshida (JP); Kiyokazu Watanabe, Fujiyoshida (JP); Takuma Horiuchi, Fujiyoshida (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 17/269,980

(22) PCT Filed: Aug. 21, 2019

(86) PCT No.: PCT/JP2019/032676
§ 371 (c)(1),
(2) Date: Feb. 19, 2021

(87) PCT Pub. No.: WO2020/040212
PCT Pub. Date: Feb. 27, 2020

(65) Prior Publication Data
US 2021/0341793 A1   Nov. 4, 2021

(30) Foreign Application Priority Data

Aug. 21, 2018  (JP) .................................. 2018-154594

(51) Int. Cl.
*G02F 1/13357* (2006.01)
*G02F 1/1335* (2006.01)

(52) U.S. Cl.
CPC .. *G02F 1/133611* (2013.01); *G02F 1/133603* (2013.01); *G02F 1/133607* (2021.01); *G02F 1/133608* (2013.01)

(58) Field of Classification Search
None
See application file for complete search history.

(56) References Cited

U.S. PATENT DOCUMENTS

2009/0257215 A1* 10/2009 Gomi ................ G02F 1/133605
362/97.1
2011/0096265 A1*  4/2011 Murakoshi ........ G02F 1/133603
349/64
(Continued)

FOREIGN PATENT DOCUMENTS

JP          2008282744 A  * 11/2008
JP          2008282744 A    11/2008
(Continued)

OTHER PUBLICATIONS

International Search Report dated Nov. 12, 2019, from counterpart International Patent Application No. PCT/JP2019/032676, 1 page.
(Continued)

*Primary Examiner* — Britt D Hanley
(74) *Attorney, Agent, or Firm* — Procopio, Cory, Hargreaves & Savitch LLP

(57) ABSTRACT

The backlight device has a substrate, a plurality of light emitting elements disposed on a surface of the substrate, a diffuser plate having an incident surface disposed facing to the surface of the substrate, and an emitting surface disposed on the opposite side of the incident surface, diffuses light incident on the incident surface from the plurality of light emitting elements, and emits the diffused light from the emitting surface, and a frame defining a light emitting region on which the plurality of light emitting elements are disposed, wherein the frame is disposed so as not to form a region less than the half value outside the light emitting elements disposed along the frame, and all of the plurality of light emitting elements are disposed so that a ratio less than the half value is 20% or less, the ratio less than the half value is a ratio of an area of the region less than the half value to an area of a surrounding region formed by connecting at least three light emitting elements disposed around the region less than the half value, and the region less than the (Continued)

half value is a region on which no half value regions of the plurality of light emitting elements are disposed.

6 Claims, 18 Drawing Sheets

(56) References Cited

U.S. PATENT DOCUMENTS

| | | |
|---|---|---|
| 2012/0008063 A1 | 1/2012 | Asamizu |
| 2012/0057096 A1* | 3/2012 | Kuromizu ......... G02F 1/133611 349/61 |
| 2012/0140446 A1 | 6/2012 | Seetzen et al. |
| 2012/0169945 A1 | 7/2012 | Kuromizu |
| 2014/0104816 A1 | 4/2014 | Takasi et al. |
| 2016/0091760 A1* | 3/2016 | Ogura ............... G02F 1/133605 362/97.1 |

FOREIGN PATENT DOCUMENTS

| | | | |
|---|---|---|---|
| JP | 2012227087 A | * | 11/2012 |
| JP | 2016066598 A | | 4/2016 |
| WO | 2011033899 A1 | | 3/2011 |

OTHER PUBLICATIONS

International Preliminary Report on Patentability dated Feb. 23, 2021, from counterpart International Patent Application No. PCT/JP2019/032676, 6 pages.

Non-Final Office Action received in U.S. Appl. No. 17/712,009, dated Jan. 23, 2023, in 28 pages.

* cited by examiner

BACKLIGHT DEVICE

CROSS-REFERENCE TO RELATED APPLICATIONS

This application is a U.S. National Stage entry of PCT Application No. PCT/JP2019/032676, filed on Aug. 21, 2019, which claims priority to JP Application No. 2018-154594, filed Aug. 21, 2018. The contents of the foregoing are incorporated by reference.

FIELD

The present invention relates to a backlight device.

BACKGROUND

Various techniques are known in a direct type backlight device using light emitting elements such as a light emitting diode (LED) elements in order to increase the uniformity of brightness by reducing the unevenness of luminance.

For example, a technique for reducing the unevenness of luminance without reducing the luminance of the outer peripheral portion is described in JP 2016-66598 to reduce the amount of light emitted to the reflective sheet disposed around LEDs, by disposing light block members that do not transmit light emitted to the outer edge side of the LEDs. Further, a technique for reducing the unevenness of luminance of a backlight device is described in JP 2008-282744 in which dot patterns dotted with dots made of ink containing white pigment are disposed on a plate surface of a diffuser plate facing to LEDs in order to uniform the brightness distribution of a backlight device. A direct type backlight device may increase the uniformity of brightness by reducing the unevenness of luminance by the techniques described in JP 2016-66598 and JP 2008-282744.

SUMMARY

However, when a backlight device becomes thinner and the number of LEDs mounted thereon for reducing the cost for a backlight device, the unevenness of luminance in a backlight device may be increased.

The object of the present invention is to provide techniques that may reduce the unevenness of luminance in a backlight device.

The backlight device according to the embodiment has a substrate, a plurality of light emitting elements disposed on a surface of the substrate, a diffuser plate having an incident surface disposed facing to the surface of the substrate, and an emitting surface disposed on the opposite side of the incident surface, diffuses light incident on the incident surface from the plurality of light emitting elements, and emits the diffused light from the emitting surface, and a frame defining a light emitting region on which the plurality of light emitting elements are disposed, wherein a half value region is defined in which light that is equal to or more than half of a peak value of a brightness of light emitted from one of the plurality of light emitting elements is incident on the incident surface, all of the plurality of light emitting elements disposed on the light emitting region are disposed so that an overlapping ratio is 20% or less, the overlapping ratio is a ratio of an area of an overlapping region to the area of the half value region defined around the one of the light emitting elements, and the overlapping region is a region overlapping the half value region defined around the one of the light emitting elements and a half value region defined around another one of the light emitting elements adjacent to the one of the light emitting elements.

It is preferable that the backlight device according to the embodiment further has a plurality of reflection members disposed on portions of the incident surface respectively facing the plurality of light emitting elements so as to reflect light emitted from the light emitting element.

It is preferable in the backlight device according to the embodiment that all of the light emitting elements disposed along the frame are disposed so that the overlapping regions are formed among the adjacent light emitting elements disposed along the frame.

It is preferable in the backlight device according to the embodiment that the frame is disposed so as not to form a region less than the half value outside the light emitting elements disposed along the frame, and all of the plurality of light emitting elements are disposed so that a ratio less than the half value is 20% or less, the ratio less than the half value is a ratio of an area of the region less than the half value to an area of a surrounding region formed by connecting at least three light emitting elements disposed around the region less than the half value, and the region less than the half value is a region on which no half value regions of the plurality of light emitting elements are disposed.

It is preferable in the backlight device according to the embodiment that each of the plurality of light emitting elements are disposed so that three light emitting elements adjacent to each other are not aligned in a straight line.

The backlight device according to the embodiment has a substrate, a plurality of light emitting elements disposed on a surface of the substrate, a diffuser plate having an incident surface disposed facing to the surface of the substrate, and an emitting surface disposed on the opposite side of the incident surface, diffuses light incident on the incident surface from the plurality of light emitting elements, and emits the diffused light from the emitting surface, and a frame defining a light emitting region on which the plurality of light emitting elements are disposed, wherein the frame is disposed so as not to form a region less than the half value outside the light emitting elements disposed along the frame, and all of the plurality of light emitting elements are disposed so that a ratio less than the half value is 20% or less, the ratio less than the half value is a ratio of an area of the region less than the half value to an area of a surrounding region formed by connecting at least three light emitting elements disposed around the region less than the half value, and the region less than the half value is a region on which no half value regions of the plurality of light emitting elements are disposed.

A backlight device according to the present invention may reduce the unevenness of luminance therein.

DESCRIPTION OF EMBODIMENTS

Hereinafter, referring to the accompanying drawings, backlight devices according to the present invention will be described in detail. It should be noted, however, that the technical scope of the present invention is not limited to those embodiments, but extends to the inventions and their equivalents described in the claims.

(Outline of Backlight Device According to the Embodiment)

In a backlight device according to the embodiment, an overlapping ratio is 20% or less, wherein a half value region is defined in which light that is equal to or more than half of a peak value of a brightness of light emitted from one of the plurality of light emitting elements is incident on the incident surface, the overlapping ratio is an ratio of an overlapping region to a half value region defined around the one of the light emitting elements, and the overlapping region is a region overlapping a half value region defined around the one of the light emitting elements and a half value region of another one of light emitting elements adjacent to the one of the light emitting elements, the half value region is a region to be equal to or more than half the peak value of the brightness of a light emitted from a light emitting element. Further, in a backlight device according to the embodiment, a ratio less than the half value is 20% or less, wherein the ratio less than the half value is a ratio of an area of a region less than the half value to an area of a surrounding region formed by connecting at least three light emitting elements disposed around the region less than the half value, and the region less than the half value is a region on which no half value regions of the plurality of light emitting elements are disposed. The unevenness of luminance in a backlight device according to the embodiment may be reduced, by disposing the light emitting elements in accordance with the above conditions.

(A Backlight Device According to a First Embodiment)

Figure 1:
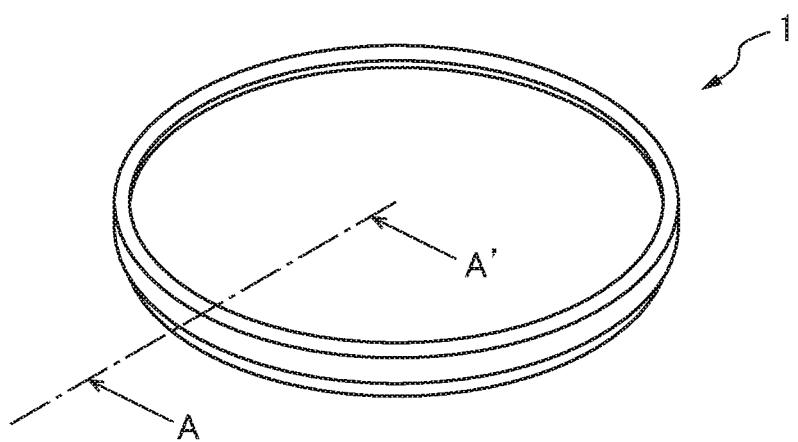
FIG. 1 is a perspective view of a backlight device according to the first embodiment.
Figure 2:
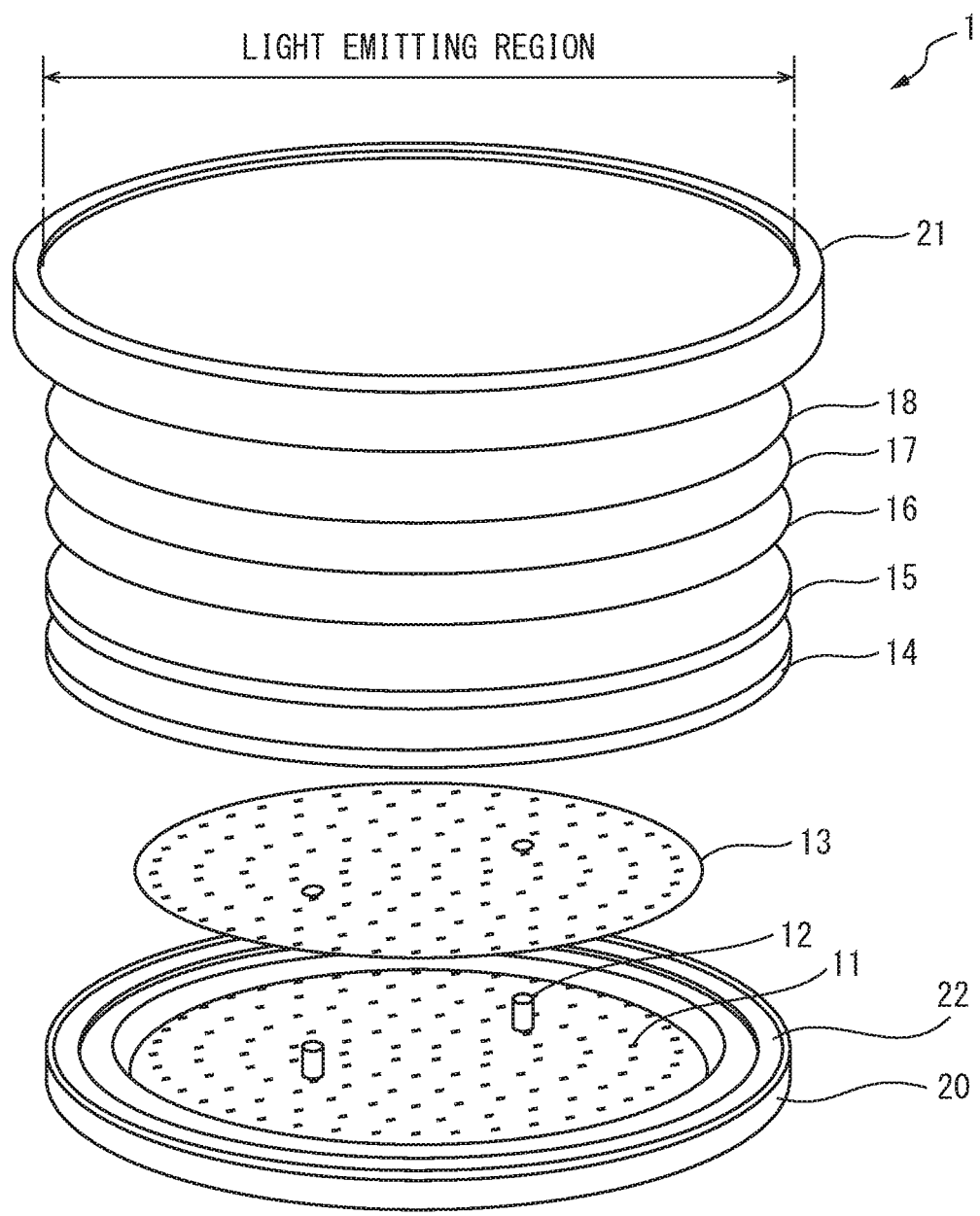
FIG. 2 is an exploded perspective view of the backlight device shown in FIG. 1.
Figure 3:
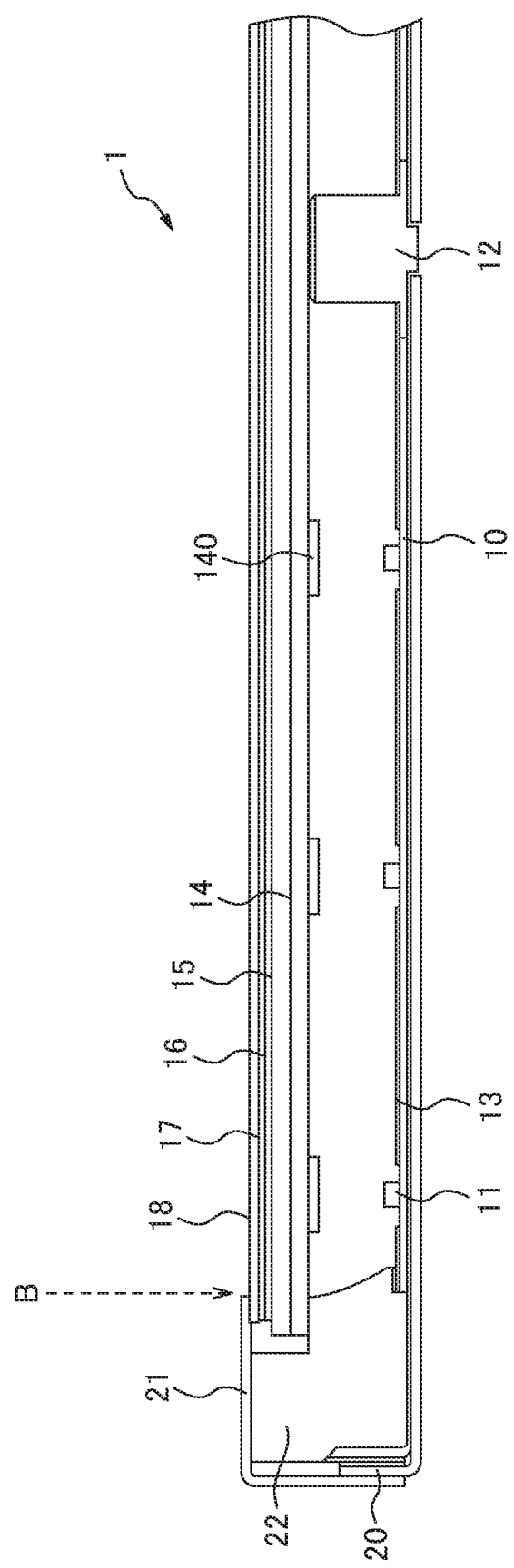
FIG. 3 is a line A-A' cross-sectional view of FIG. 1.

FIG. 1 is a perspective view of a backlight device according to the first embodiment, FIG. 2 is an exploded perspective view of the backlight device shown in FIG. 1, and FIG. 3 is a line A-A' cross-sectional view of FIG. 1.

A backlight device 1 has a mounting board 10, a plurality of LEDs 11, a pair of struts 12, a reflective sheet 13, a first diffuser plate 14, a second diffuser plate 15, a prism sheet 16, a polarizing sheet 17 and a directional control sheet 18. Further, the backlight device 1 has a back case 20, the front case 21 and a resin frame 22. The backlight device 1 has a circular outer shape in a planar view, a backlight device according to the embodiment may have a square outer shape in a planar view.

The mounting substrate 10 is, for example, a glass epoxy substrate made of glass fibers and an epoxy resin, a substrate formed of paper phenol, paper epoxy and a resin substrate based on a polyimide resin substrate. Wiring patterns (not shown) are formed on front and rear surfaces of the mounting substrate 10. The wiring patterns on the front surface supply electric signals supplied through vias (not shown) from the wiring patterns on the rear surface to each of the plurality of LEDs 11, and therefore each of the plurality of LEDs 11 emits light.

The LED 11 is an example of a light emitting element used as a light source for the backlight device 1, and is, for example, a packaged surface mount type LED element. For example, the LED 11 has a package made of a white resin with recesses, an LED chip referred to as a die primarily mounted on a bottom surface of the recesses of the package, and a sealing member enclosed within the recesses of the package. The sealing member is made of a translucent resin material such as a silicone resin. For example, the LED 11 has a blue LED die emitting blue light and yellow phosphors such as yttrium aluminum garnet ($Y_3Al_5O_{12}$, YAG) contained in the sealing member, and emits white light. In this specification, the brightness of the light emitted from the LED 11 means the brightness of the light emitted from the LED 11 when the rated current is applied to the LED 11.

Each of the pair of struts 12 is made of a white resin, is a member standing from the back case 20, and supports each of the first diffuser plate 14 to the directional control sheet 18 from below. Although the backlight device 1 has a pair of struts 12, a backlight device according to the embodiment may have a plurality of struts.

The reflective sheet 13 is a sheeted reflecting member having a light reflective surface, and is mounted or attached to a surface of the mounting substrate 10. A plurality of openings having a shape corresponding to each of the plurality of LEDs 10 and the pair of struts 12 are formed on the reflective sheet 13.

The outer edge of the first diffuser plate 14 is supported by the resin frame 22, the vicinity of the center of the first diffuser plate 14 is supported by the pair of struts 12, and therefore the first diffuser plate 14 is disposed above the mounting substrate 10 so that the first diffuser plate 14 covers the LEDs 11 disposed on the surface of the mounting substrate 10. The first diffuser plate 14 has an incident surface disposed facing to the surface of the mounting substrate 10, and an emitting surface disposed on the opposite side of the incident surface, and diffuses light incident on the incident surface from a plurality of LEDs 11 and emits the diffused light from the emitting surface. A reflection material 140 referred to as a lighting curtain layer is disposed on the incident surface of the first diffuser plate 14. The reflection material 140 is a white light shielding member such as titanium oxide, barium sulfate that shield and reflects a part of light emitted from the LEDs 11, and although the reflection material 140 is formed by screen printing, the reflection material 140 may be integrated with the diffuser plate by molding methods such as ejection. The reflection material 140 may be a diffusion member such as glass or silicon oxide, or ink members having a black color. The reflection material 140 is disposed directly above each of the plurality of LEDs 11 having the highest brightness of light emitted from each of the plurality of LEDs 11, and reflects the incident light toward the reflective sheet 13. The imbalance of the brightness of the light incident on the first diffuser plate 14 is reduced between the directly above portion and another portion of each of the plurality of LEDs 11, since the reflection material 140 reflects the incident light to the direction of the reflecting sheet 13.

Figure 4:
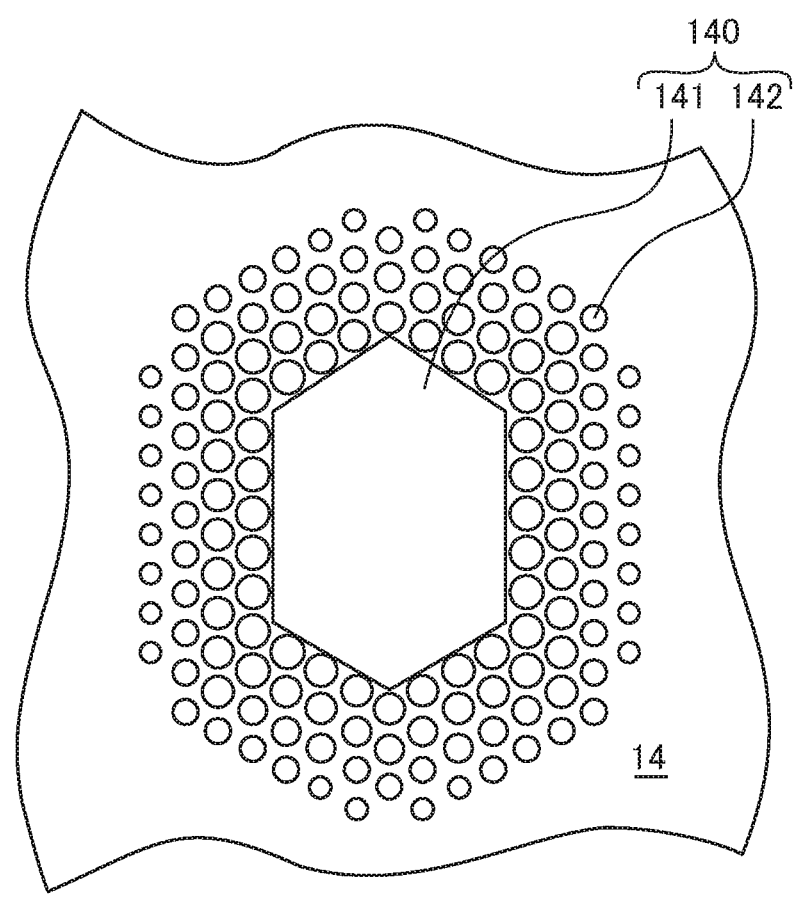
FIG. 4 is a portion enlarged view of a position of the incident surface of the first diffuser plate facing to each of a plurality of LEDs shown in FIG. 2.

FIG. 4 is a portion enlarged view of a position of the incident surface of the first diffuser plate 14 facing to each of a plurality of LEDs 11.

The reflection material 140 has a hexagonal first reflector 141 and a plurality of circular second reflectors 142. The first reflector 141 is disposed directly above the LED 11 so as to cover the entire LED 11, and the second reflectors 142 are disposed around the first reflector 141 so as to maintain the hexagonal shape as a whole. The second reflectors 142 are formed so as to be smaller as the distances from the first reflector 141 are longer.

The second diffuser plate 15 is a flat member disposed so as to cover the emitting surface of the first diffuser plate 14. The second diffuser plate 15 has an incident surface disposed opposite to the surface of the mounting substrate 10 through the first diffuser plate 14, and an emitting surface disposed on the opposite side of the incident surface, and further diffuses the light incident to the incident surface from the first diffuser plate 14 and emits the diffused light from the emitting surface. The diffusivity of the second diffuser plate 15 is higher than that of the first diffuser plate 14, the second diffuser plate 15 diffuses the light emitted from the LED 11 so that the diffused light has a desired spread, by further diffusing the light diffused by the first diffuser plate 14. The diffusivity of each of the first diffuser plate 14 and the second diffuser plate 15 is adjusted by adjusting the Haze value, diffusivity and light transmittance thereof, and defining the thickness and emboss shape thereof.

The prism sheet 16 is a flat optical member made of a synthetic resin such as acrylic resin, and is disposed so as to cover the emitting surface of the second diffuser plate 15. The prism sheet 16 has an incident surface facing to the emitting surface of the second diffuser plate 15, and an emitting surface disposed on the opposite side of the incident surface, and emits light emitted from the emitting surface of the second diffuser plate 15 in the vertical direction.

The polarizing sheet 17 is a flat plated optical member having a synthetic resin such as polyvinyl alcohol in which Iodine and stain is dyed and adsorbed, and is disposed so as to cover an emitting surface of the prism sheet 16. The polarizing sheet 17 has an incident surface facing to the emitting surface of the prism sheet 16, and an emitting surface disposed on the opposite side of the incident surface thereof. The polarizing sheet 17 emits polarized light emitted from the emitting surface of the prism sheet 16 so as to align in the direction with the polarization axis of the liquid crystals of an LCD device (not shown) disposed on the backlight device 1.

The directional control sheet 18 is a flat optical member made of a synthetic resin such as acrylic resin, and is disposed so as to cover the emitting surface of the polarizing sheet 17. The directional control sheet 18 has an incident surface facing to the emitting surface of the polarizing sheet 17, and an emitting surface disposed on the opposite side of the incident surface thereof. The directional control sheet 18 is formed so as to emit light emitted from the emitting surface of the polarizing sheet 17 in a desired direction. For example, the directional control sheet 18 controls a light direction so that the light may be easily viewed by an occupant of the vehicle such as a driver, when the backlight device 1 is used as a backlight of an on-board display device. Further, the directional control sheet 18 controls a light direction so that an image displayed on a display device is not reflected on windshields.

The back case 20 is made of a metal material such as aluminum and stainless steel, and is a concave member that houses the mounting substrate 10 to the directional control sheet 18 and the resin frame 22. The front case 21 is made of a metallic material such as aluminum and stainless steel or a synthetic resin such as polycarbonate, and functions as a housing of backlight device 1 along with the back case 20. A circular opening is formed on the front case 21, and light is emitted from the opening formed on the front case 21.

The resin frame 22 is made of a synthetic resin such as polycarbonate and a recess formed for housing the mounting substrate 10 to the reflective sheet 13. Further, a step for supporting the first diffuser plate 14 to directional control sheet 18 is formed on the inner edge of the resin frame 22. The resin frame 22 is a frame defining a light emitting region and a region inside the inner edge of the front case 21 and the resin frame 22 shown by a broken line arrow B in FIG. 3 is defined as the light emitting region on which the plurality of LEDs 11 are disposed. Wiring patterns for supplying power to the LEDs 11 may be formed on a surface of the resin frame 22.

Figure 5:
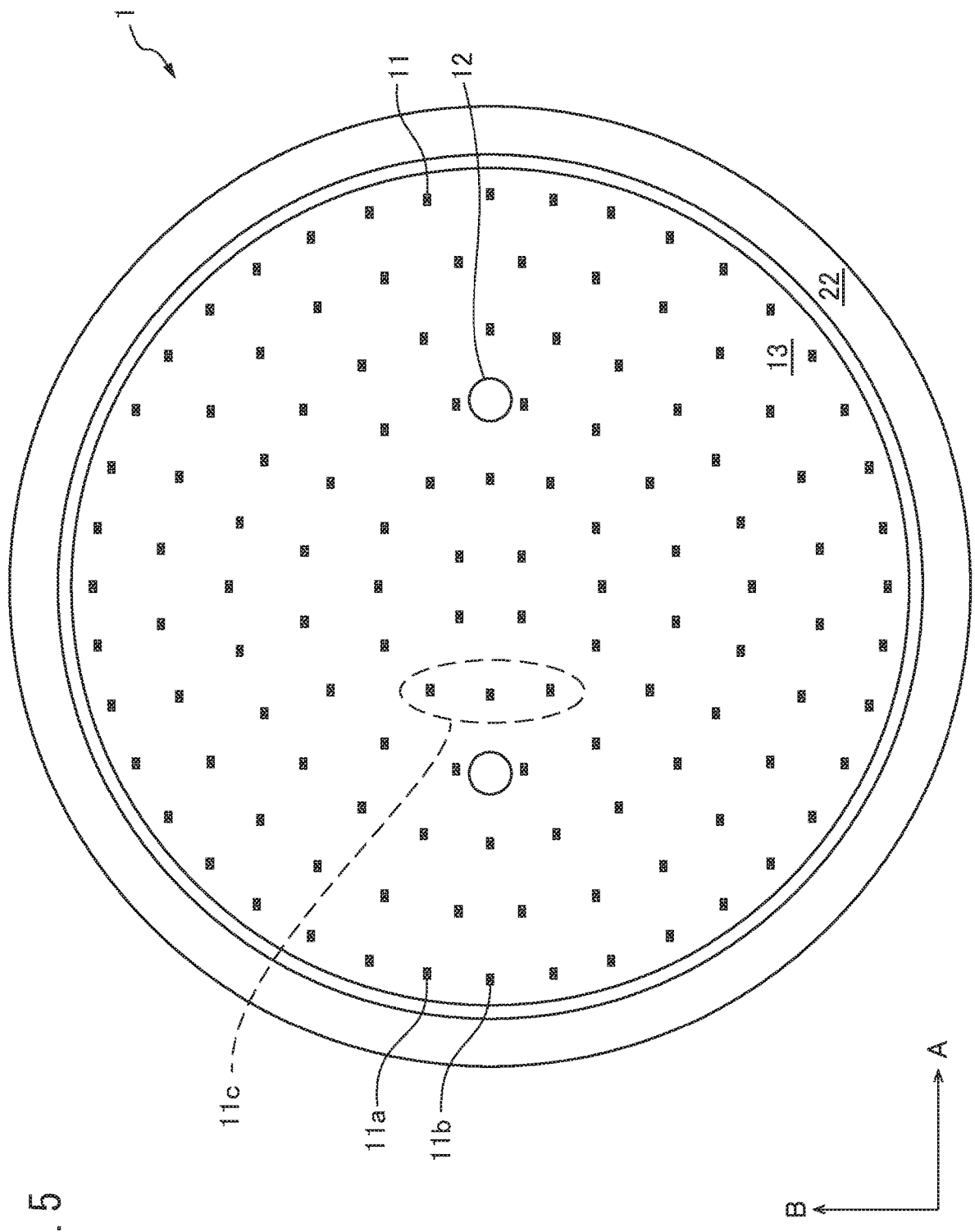
FIG. 5 is a plan view showing the arrangement of the LEDs and the pair of struts 12.
Figure 6:
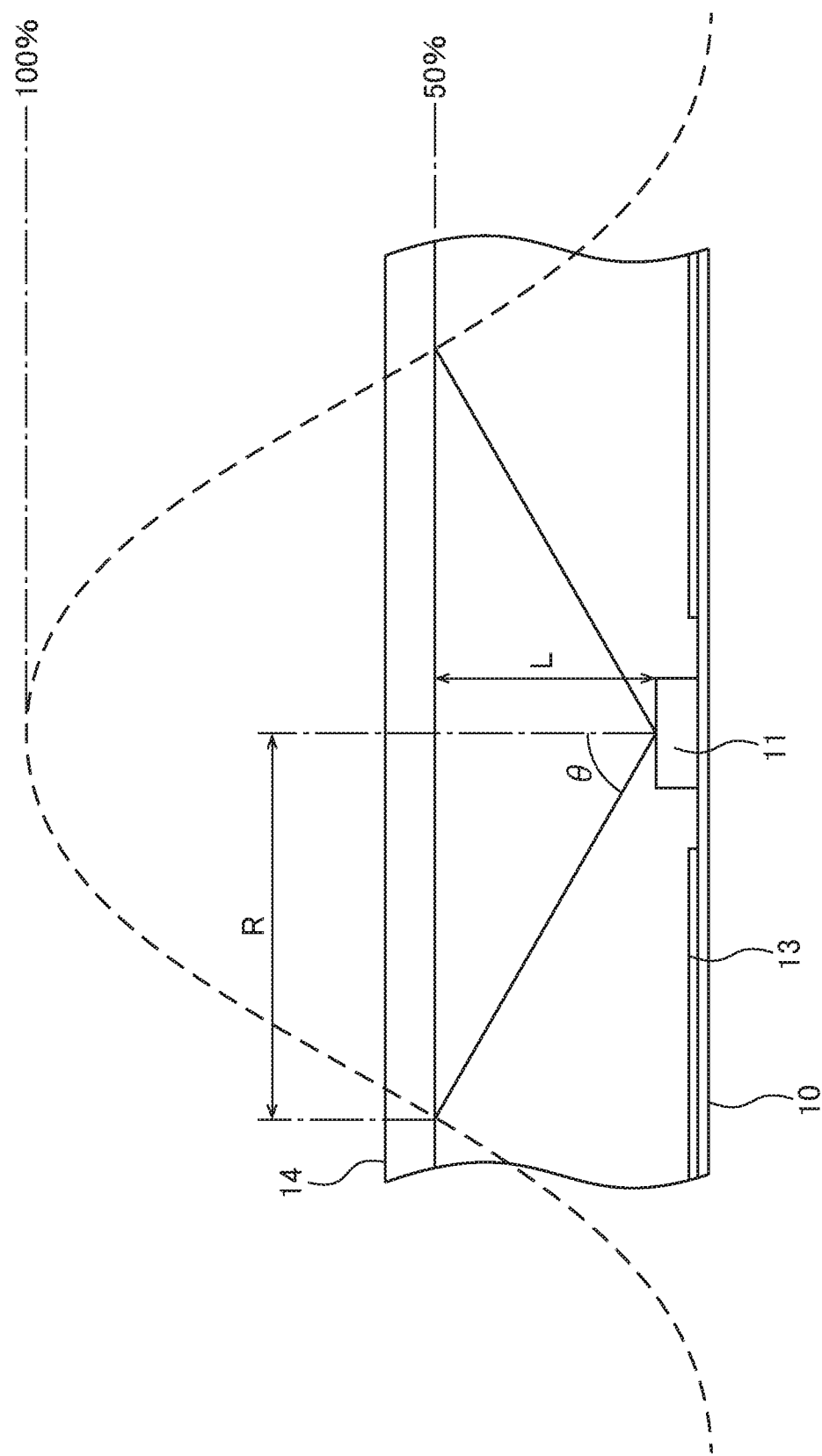
FIG. 6 is a figure for explaining the half value region.

FIG. 5 is a plan view showing the arrangement of the LEDs 11 and the pair of struts 12, and FIG. 6 is a figure for explaining the half value region.

Each of the plurality of LEDs 11 is disposed such that the half value regions satisfy a predetermined requirement. The half value region is a region defined by a half value angle θ which is an angle to be half the peak value of the brightness of the light, and a distance L between a surface of an LED 11 and the incident surface of the first diffuser plate 14. Specifically, the half value region is a substantially circular region included in the distance of $R = L \tan \theta$ from the center of an LED 11 in a planar view of the LED 11. The half value region is defined with respect to a surface facing to the substrate, i.e. the incident surface of the diffuser plate. Each of the plurality of the LEDs 11 is disposed so that the half value region which is a substantially circular region included in the distance of $R = L \tan \theta$ from the center of an LED 11 in a planar view of the LED 11 satisfy the following four requirements.

(First Requirement)

A plurality of LEDs 11 is disposed so that an overlapping ratio is 20% or less, wherein the overlapping ratio is a ratio of an area of an overlapping region 111 to an area of the half value region 110 defined around the one of the plurality of LEDs 11, and the overlapping region 111 is a region overlapping a half value region 110 defined around one of the LEDs 11 and a half value region defined around another one of LEDs 11 adjacent to the one of the LEDs 11.

(Second Requirement)

The plurality of LEDs 11 are disposed so that a ratio less than the half value is 20% or less, wherein the ratio less than the half value is a ratio of a an area of the region less than the half value 112 to an area of a surrounding region 113 formed by connecting among the plurality of LEDs 11 disposed around the region less than the half value 112, and the region less than the half value 112 is a region on which no half value regions of the plurality of LEDs 11 are disposed.

(Third Requirement)

All of the LEDs 11 disposed along the resin frame 22 are disposed so that the overlapping regions are formed among the adjacent LEDs 11 disposed along the resin frame 22.

(Fourth Requirement)

Each of the plurality of LEDs 11 are disposed so that three LEDs 11 adjacent to each other are not aligned in a straight line.

The LEDs 11 disposed along the resin frame 22 are disposed so that no regions less than the half value are formed on the outside of the LEDs. The LED 11 disposed along the resin frame 22 is disposed so that no regions less than the half value are formed between the LED and the resin frame 22. It is preferable that the LEDs 11 disposed along the resin frame 22 are disposed so that the outer ends of the overlapping regions between the LEDs 11 disposed adjacent along the resin frame 22 are contacted with the inner edge of the resin frame 22.

Although a part of the half value region defined around an LED 11 disposed along the resin frame 22 overlaps the resin frame 22, the half value region defined around an LED 11 disposed along the resin frame 22 is defined as substantially circular in first requirement, similar to other LEDs 11. Further, the outer side of LEDs 11 disposed along the resin frame 22 are not objects of the second requirement, since no regions less than the half value are formed between the LEDs 11 disposed along the resin frame 22 and the resin frame 22.

The first requirement indicates that an overlapping ratio (Alap/Ahalf) is 20% or less, wherein the overlapping ratio (Alap/Ahalf) is a ratio of an area Alap of an overlapping region to the area Ahalf of the half value region defined around the one of the plurality of LEDs 11, and the overlapping region is a region overlapping a half value region defined around one of the LEDs 11 and half value region defined around another one of LEDs 11 adjacent to the one of the LEDs 11. The LEDs 11 are disposed so as to satisfy the first requirement, and therefore the area of the overlapping regions formed between the adjacent pair of the LEDs 11 is increased, and the overlapping region having a brightness higher than a desired brightness between the adjacent pair of the LEDs 11 is prevented from being formed.

The second requirement indicates that a ratio (Abelow/Aaround) of a less than half value is 20% or less, wherein the ratio (Abelow/Aaround) is a ratio of an area Abelow of a region less than the half value to an area Aaround of a surrounding region formed by connecting among the plurality of LEDs 11 disposed around the region less than the half value, and the region less than the half value is a region on which no half value region 110 of the plurality of LEDs 11 are disposed. The LEDs 11 are disposed so as to satisfy the second requirement, and therefore the areas of the regions less than the half value formed among the at least three LED 11 are decreased, and the regions less than the half value having a luminance lower than a desired luminance is prevented from being formed among the LEDs 11.

The third requirement indicates that each of LEDs 11 disposed along the resin frame 22 is disposed so that the overlapping regions are formed between the LEDs adjacent to each other along the resin frame 22. Thus, the third requirement indicates that each of the LEDs 11 disposed along the outer edge of the plurality of LEDs 11 are disposed so that the adjacent half value regions along the resin frame 22 are overlapped in order to form overlapping regions, as indicated by reference numeral 11a and 11b in FIG. 5. The LEDs 11 are disposed so as to satisfy the third requirement, and therefore overlapping regions are formed among all of the LEDs 11 disposed along the resin frame 22, and the brightness of the outer edge of the light emitting region is prevented from being low.

The fourth requirement indicates that each of the plurality of LEDs 11 are disposed so that three LEDs 11 adjacent to each other are not aligned in a straight line, as indicated by reference numeral 11c in FIG. 5. Thus, the fourth requirement indicates that three LEDs 11 adjacent are not aligned in a straight line either in a first direction indicated by arrow A in FIG. 5 and a second direction orthogonal to the first direction and indicated by arrow B in FIG. 5. In the present specification, an arrangement where the LEDs 11 are aligned in a straight line indicates that facing sides of the LEDs 11 disposed adjacent to the first and second directions are overlapped more than a half of a short side length of the LED 11. On the other hand, an arrangement in which the LEDs 11 are not aligned in a straight line indicates that facing sides of the LEDs 11 disposed adjacent to the first and second directions are not overlapped more than a half of a short side length of the LED 11. The LEDs 11 are disposed so as to satisfy the fourth requirement, and therefore linear regions having high brightness prevented from being generated in a light emitting region.

Figure 7A:
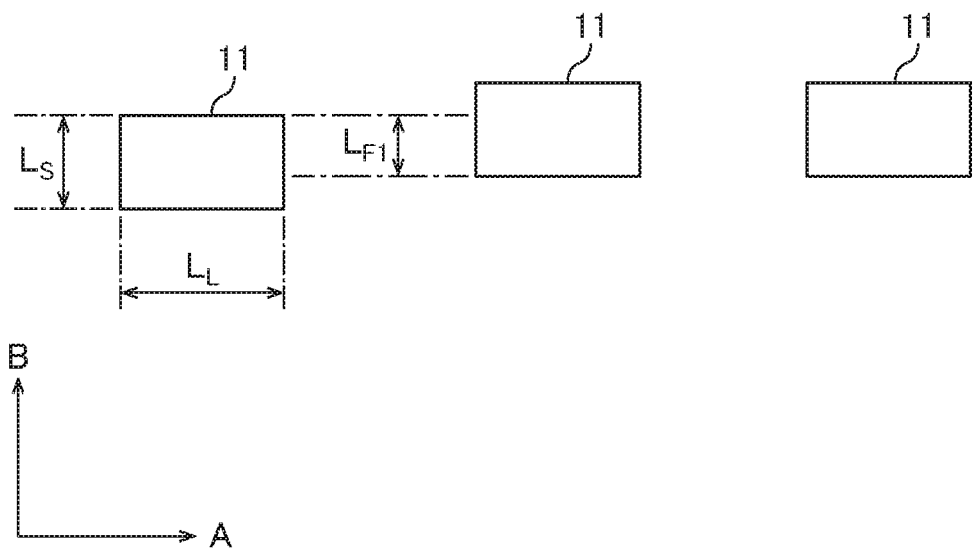
FIG. 7A is a figure showing an example in which three LEDs adjacent are aligned in a straight line.
Figure 7B:
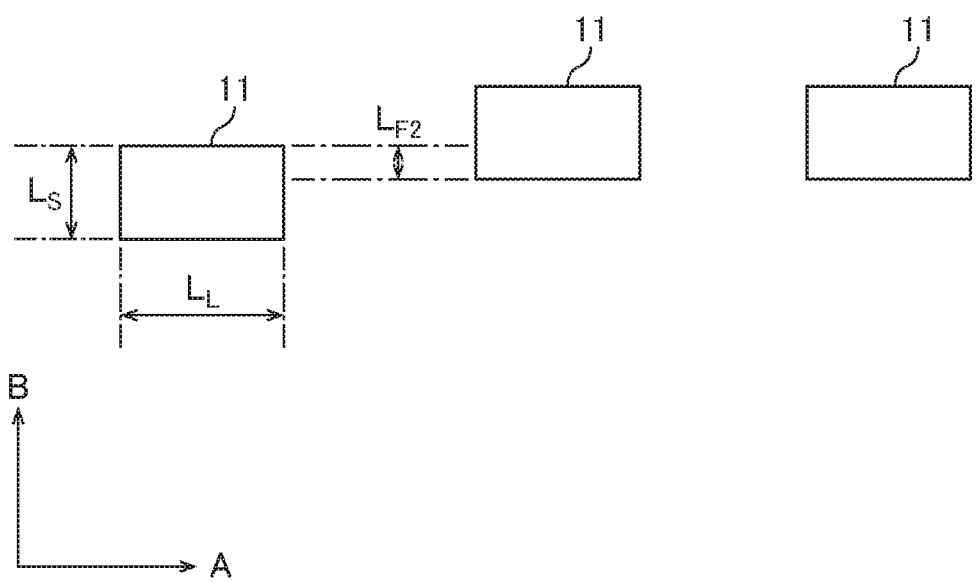
FIG. 7B is a figure showing an example in which three LEDs adjacent are not aligned in a straight line.

FIG. 7A is a figure showing an example in which three LED 11 adjacent are aligned in a straight line, and FIG. 7B is a figure showing an example in which three LED 11 adjacent are not aligned in a straight line. In FIGS. 7A and 7B, the long side length of the LED 11 in a plain view is indicated by LL, the short side length of the LED 11 in a plain view is indicated by LS.

When the overlapped length LF1 of facing sides of the LEDs 11 disposed adjacent to the first and second directions is equal to or greater than the half of the short side length LS/2 of LED 11, the adjacent LEDs 11 are aligned in a straight line. On the other hand, when the overlapped length LF2 of the facing sides of the LEDs 11 disposed adjacent to the first direction and the second direction is less than the half of the short side LS/2 of the LED 11, the adjacent LEDs 11 are aligned in a straight line.

(Effect of Operation of Backlight Device According to the First Embodiment)

Since a plurality of LEDs in a backlight device according to the first embodiment are disposed so that the first and second requirements are satisfied, the unevenness of luminance among adjacent LEDs may be within ±2% in which light and dark are not visually recognized by a person.

Figure 8A:
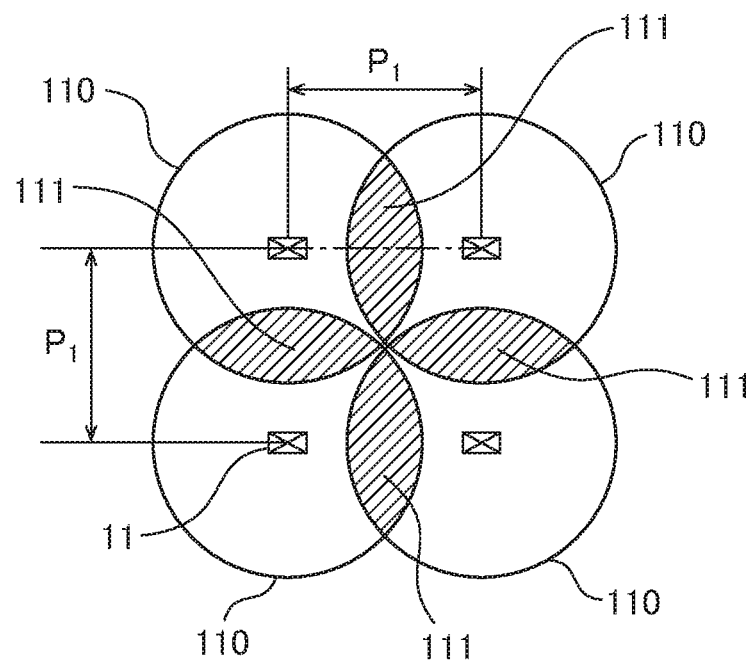
FIG. 8A is a figure showing an example of an arrangement in which an overlapping ratio between adjacent LEDs is 20% or less.
Figure 8B:
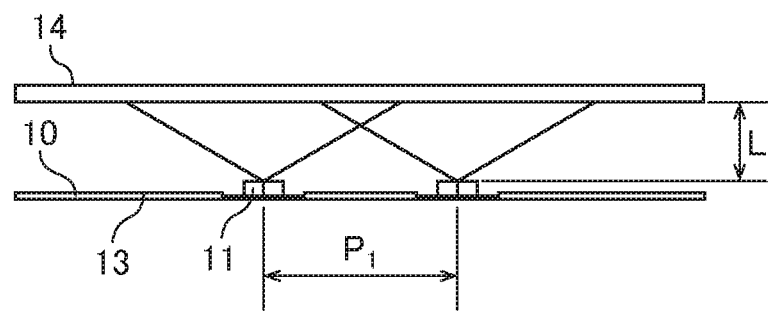
FIG. 8B is a cross-sectional view corresponding to the arrangement shown in FIG. 8A.
Figure 8C:
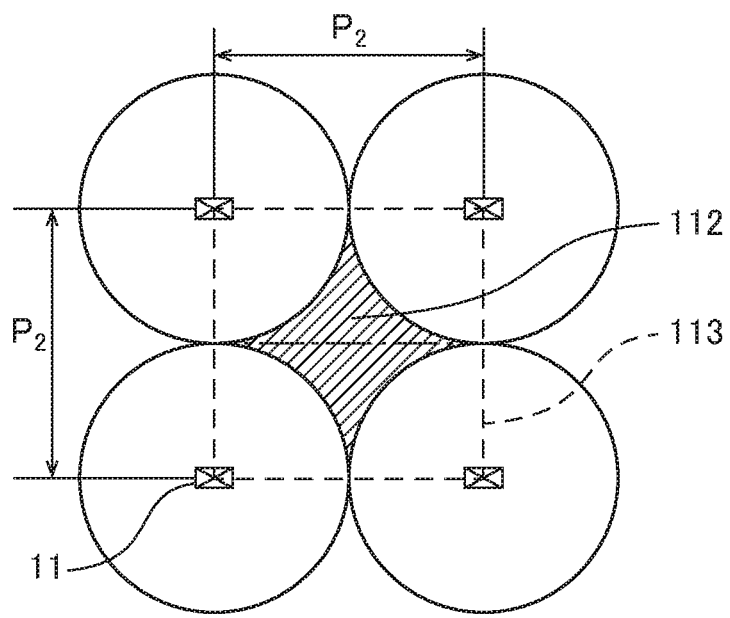
FIG. 8C is a figure showing an example of arrangement in which a ratio less than the half value is 20% or less.
Figure 8D:
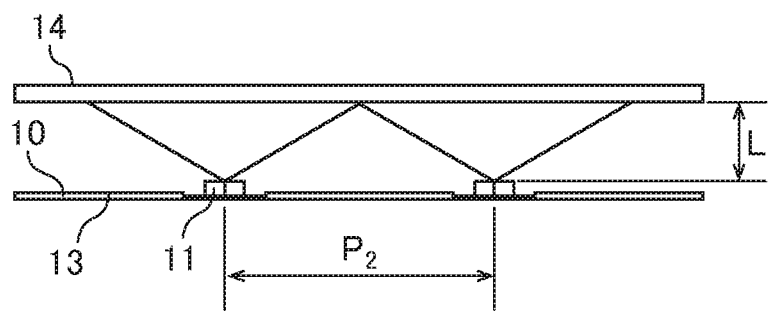
FIG. 8D is a cross-sectional view corresponding to the arrangement shown in FIG. 8C.

FIG. 8A is a figure showing an example of an arrangement in which an overlapping ratio between adjacent LEDs is 20% or less, and FIG. 8B is a cross-sectional view corresponding to the arrangement shown in FIG. 8A. FIG. 8C is a figure showing an example of arrangement in which a ratio less than the half value is 20% or less, FIG. 8D is a cross-sectional view corresponding to the arrangement shown in FIG. 8C.

In the arrangement shown in FIG. 8A, the overlapping ratio is 20% or less, and a ratio less than the half value is 0%. On the other hand, in the arrangement shown in FIG. 8C, the ratio less than the half value is 20% or less, and the overlapping ratio is 0%.

In the arrangement shown in FIG. 8A, the LEDs 11 are disposed in first arrangement interval P1 (=18 mm), and the distance between the surface of LEDs 11 and the incident surface of the first diffuser plate 14 is L (=6.188 mm). In the arrangement shown in FIG. 8C, the LEDs 11 are disposed in a second arrangement interval P2 (=13 mm), and the distance between the surface of the LEDs 11 and the incident surface of the first diffuser plate 14 is L.

Figure 9A:
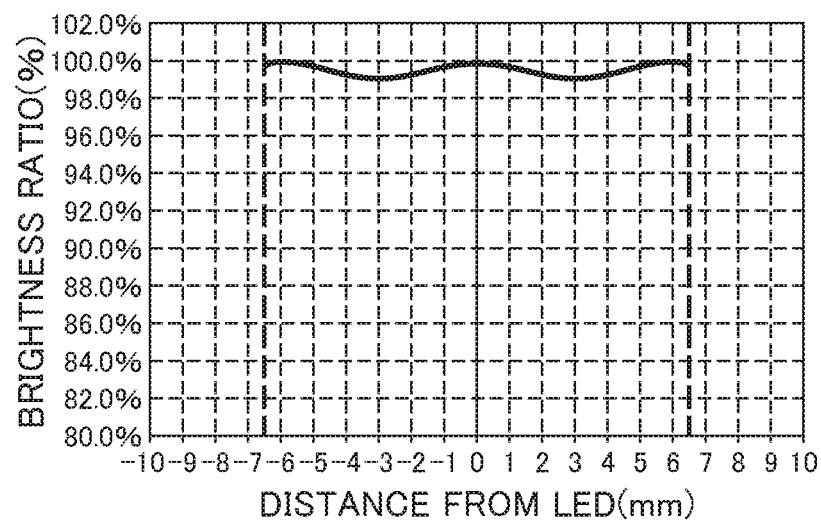
FIG. 9A is a figure showing a relationship between the distance from the LEDs and the brightness ratio in the arrangement shown in FIG. 8A.
Figure 9B:
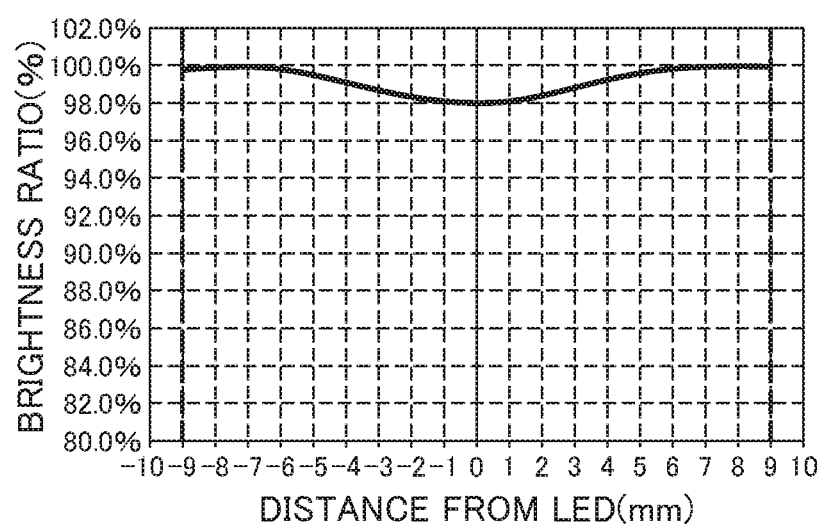
FIG. 9B is a figure showing a relationship between the distance from the LEDs and the brightness ratio in the arrangement shown in FIG. 8C.

FIG. 9A is a figure showing a relationship between the distance from the LEDs 11 and the brightness ratio in the arrangement shown in FIG. 8A, and FIG. 9B is a figure showing a relationship between the distance from the LEDs 11 and the brightness ratio in the arrangement shown in FIG. 8C.

In the arrangement shown in FIG. 8A and the arrangement shown in FIG. 8C, since the difference in the luminance ratio corresponding to the unevenness of luminance between the adjacent LEDs 11 is both 2% or less, the unevenness of luminance between the adjacent LEDs 11 is not visible by a person.

Further, in a backlight device according to the first embodiment, since each of the LED 11 disposed along the outer edge is disposed so that overlapping regions are formed between the LEDs adjacent to each other, no bright linear regions in the radiant light referred to as hot spots may be formed.

Further, in a backlight device according to the first embodiment, since an arrangement of the LEDs 11 are determined based on the half value region in which the light having more than half the peak value of the brightness of the light emitted from LED 11 is incident on the incident surface, it is easy to uniform the brightness of the light emitted from the backlight device.

Figure 10:
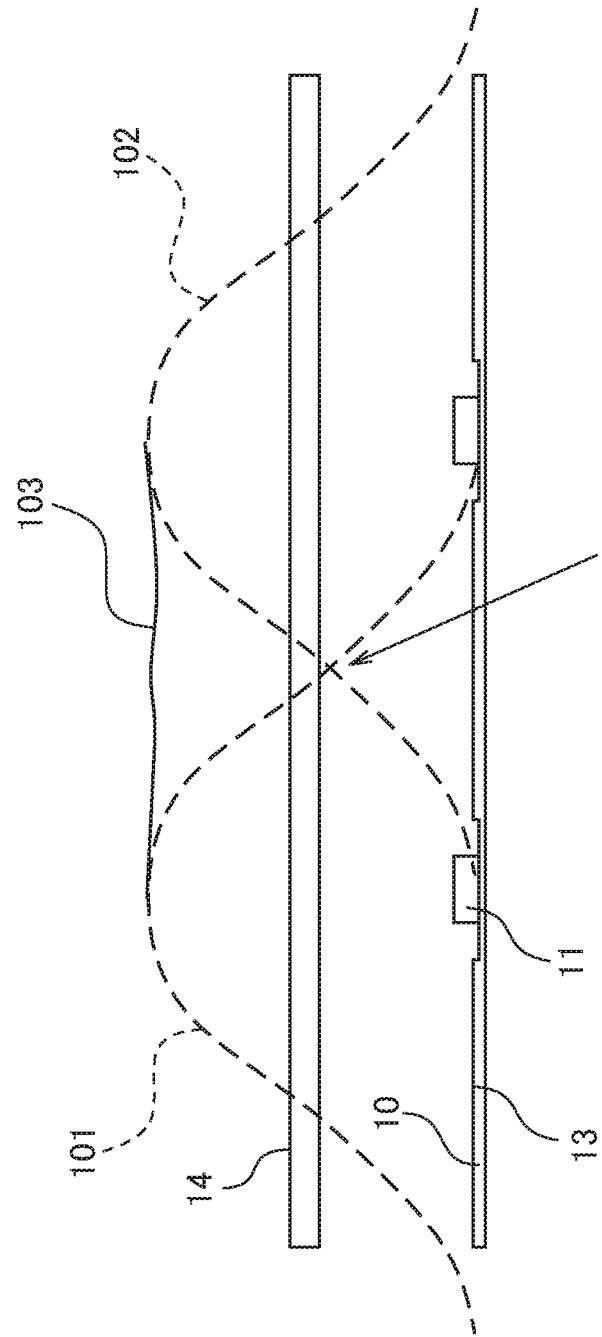
FIG. 10 is a figure showing a luminance distribution in the arrangement shown in FIG. 8C.

FIG. 10 is a figure showing a luminance distribution in the arrangement shown in FIG. 8C. In FIG. 10, a broken line 101 shows a luminance distribution of light emitted from one of the LEDs 11, a broken line 102 shows a luminance distribution of light emitted from another of the LEDs 11, and a solid line 103 shows a luminance distribution of light combined light emitted from both LEDs 11.

In the arrangement shown in FIG. 10, the brightness of the combined lights at the midpoint of the two LED 11 is substantially twice the half value of the peak value, and therefore the brightness thereof is substantially similar to the peak value. Further, as the brightness between the two LEDs 11 of the light emitted from one of the LEDs 11 is decreased, the brightness between the two LEDs 11 of the light emitted from another one of the LEDs 11 is increased, and therefore the brightness of the combined light is substantially similar to the peak value. In the backlight device according to the first embodiment, the arrangement of the LEDs 11 is determined based on the half value region, and therefore an arrangement of the LEDs 11 may be easily determined in order to uniform the brightness of light emitted from the backlight device.

(A Backlight Device According to the Second Embodiment)

Figure 11A:
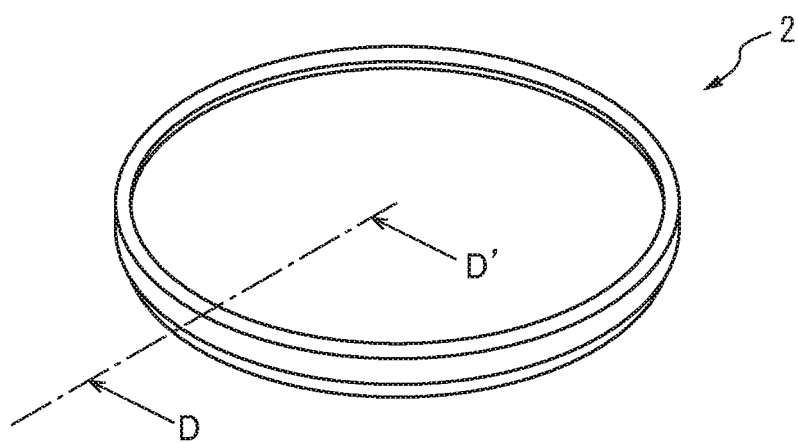
FIG. 11A is a perspective view of a backlight device according to the second embodiment.
Figure 11B:
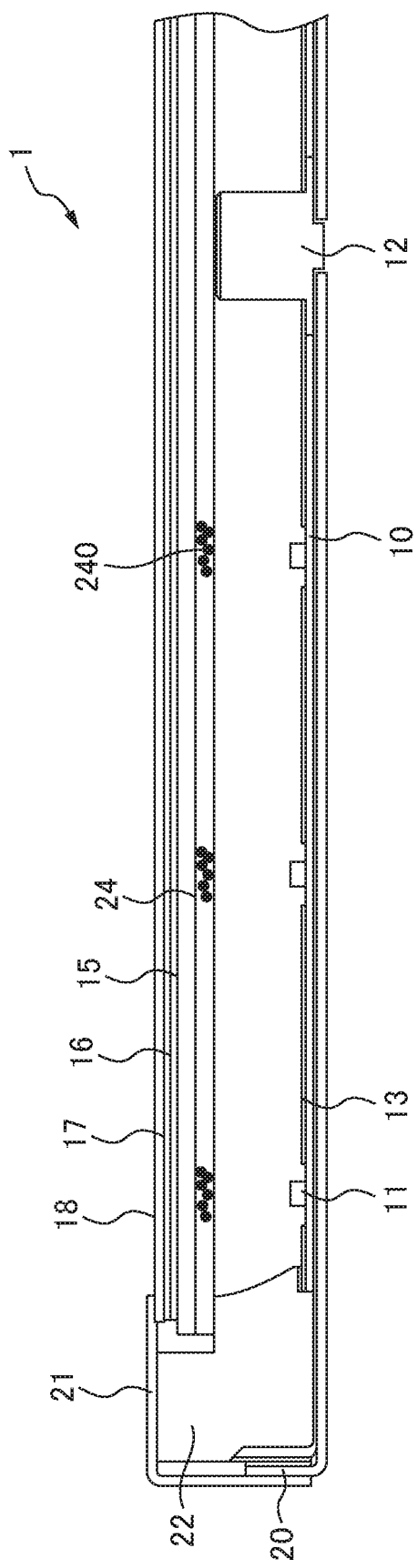
FIG. 11B is a D-D' line sectional view of FIG. 11A.

FIG. 11A is a perspective view of a backlight device according to the second embodiment, and FIG. 11B is a D-D' line sectional view of FIG. 11A.

A backlight device 2 is different from the backlight device 1 in that the backlight device 2 has a first diffuser plate 24 instead of the first diffuser plate 14. Since components in the backlight device 2 other than the first diffuser plate 24 have the same structures and functions as those of components in the backlight device 1 having the same reference numerals, a detailed description thereof will be omitted.

The first diffuser plate 24 is different from the first diffuser plate 14 in that the reflection material 140 is not disposed on the incident surface. Further, the first diffuser plate 24 is different from the first diffuser plate 14 in that the first diffuser plate 24 contains reflection materials 240. The reflection material 240 is a member for shielding and reflecting a part of the light emitted from the LED 11 similarly to the reflection material 140. The reflection materials 240 are disposed directly above each of the plurality of LEDs 11 having the highest brightness of the light emitted from each of the plurality of LEDs 11, and reflects the incident light toward the reflective sheet 13.

The reflection material 240 is a white light shielding member such as titanium oxide, barium sulfate and etc. that shields and reflects a portion of the light emitted from LED 11, and is formed by integrally molded with the diffuser plate by molding methods such as ejection. The reflection material 240 may be a diffusion member such as glass, silicon oxide or an ink member having a black color.

In a backlight device according to the embodiment, each of the plurality of LEDs 11 may be disposed so as to satisfy the first to fourth requirements, and the LEDs may be disposed such that three LEDs form a triangular shape.

Figure 12A:
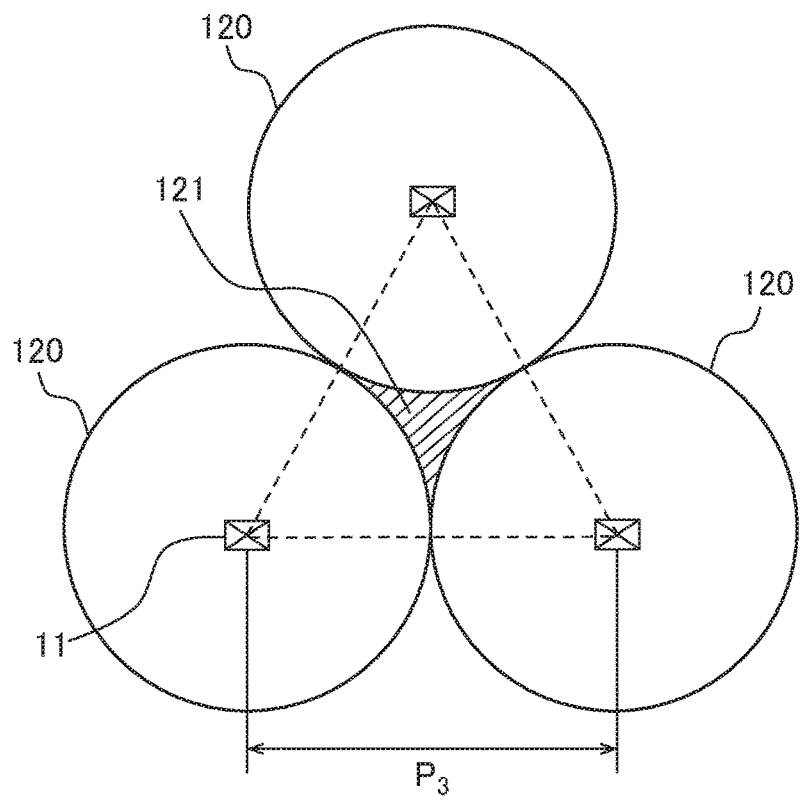
FIG. 12A is a figure showing an example of the arrangement of LEDs in a backlight device according to the embodiment.
Figure 12B:
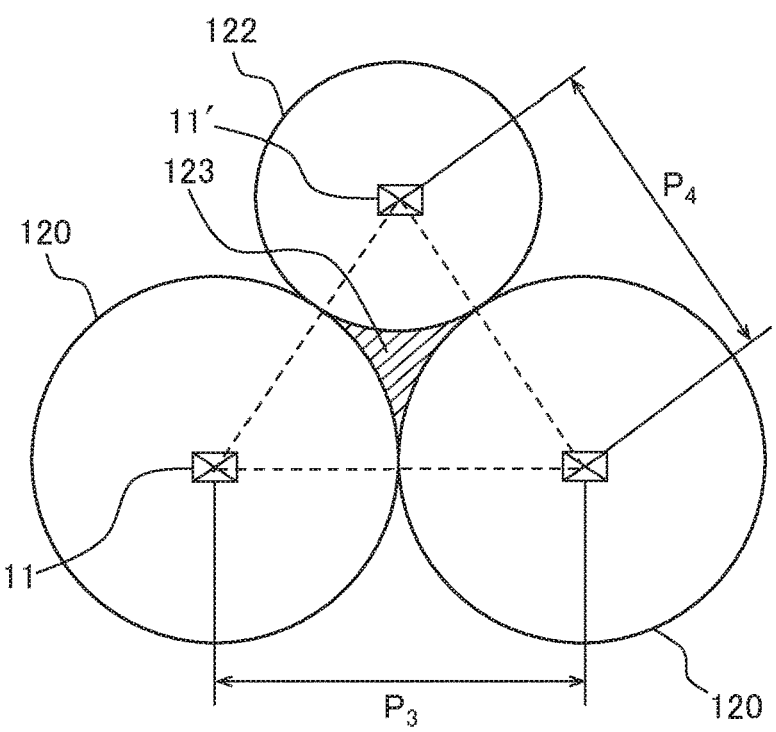
FIG. 12B is a figure showing the other example of the arrangement of LEDs in a backlight device according to the embodiment.

FIG. 12A is a figure showing an example of the arrangement of LEDs in a backlight device according to the embodiment, and FIG. 12B is a figure showing the other example of the arrangement of LEDs in a backlight device according to the embodiment.

In the arrangement shown in FIG. 12A, the three LEDs 11 are disposed in an equilateral triangular shape. The arrangement interval among the three LEDs 11 is the third arrangement interval P3. The three LEDs 11 are disposed in an equilateral triangular shape at the third arrangement interval P3, and therefore the overlapping ratio is 0%, the ratio less than the half value is 9.3%.

In the arrangement shown in FIG. 12B, the two LEDs 11 and one LED 11' are disposed in an isosceles triangular shape. The rated value of the brightness of the LED 11' is lower than that of the brightness of the LEDs 11, and the radius of a half value region defined around the LED 1' is shorter than that of a half value region defined around the LEDs 11. An arrangement interval between the two LEDs is a third arrangement spacing P3 similarly to the arrangement example shown in FIG. 12A. An arrangement interval between each of the two LED 11 and LED 11' is shorter than the third arrangement interval P3. The two LEDs 11 and the LED 11' are disposed in an isosceles triangular shape, and therefore the overlapping ratio is 0%, the ratio less than the half value is lower than 9.3%.

Further, although the reflection materials 140 and 240 are respectively disposed in backlight device 1 and 2 in addition to the first diffuser plate 14 and 24, in a backlight device according to the embodiment, only the diffuser is disposed, and no reflection materials may be disposed therein.

Example

Figure 13:
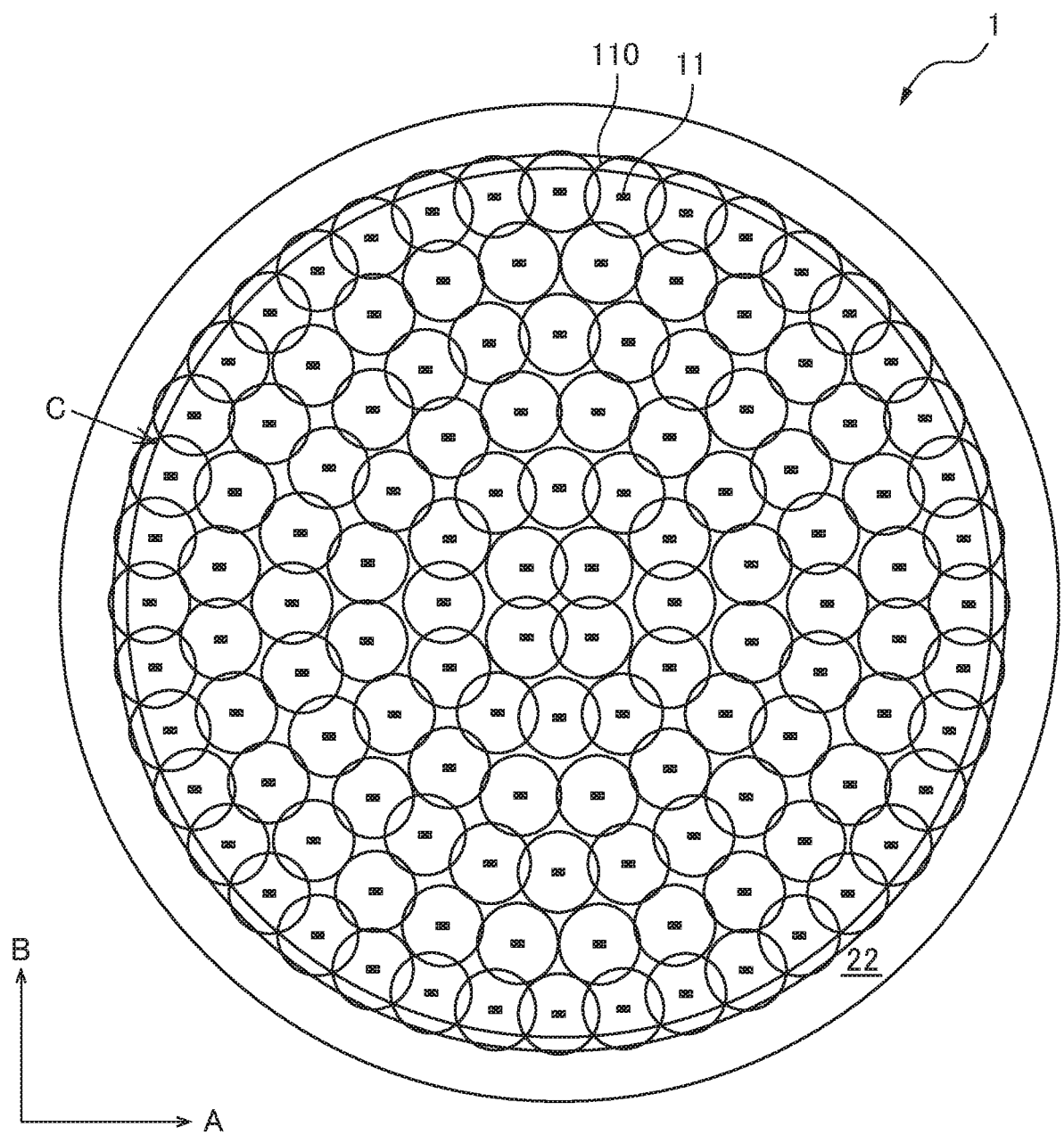
FIG. 13 is a figure showing a relationship between the LEDs and the half value regions according to the exemplary embodiment.

FIG. 13 is a figure showing a relationship between the LEDs 11 and the half value regions according to the exemplary embodiment.

The LEDs 11 disposed along the resin frame 22 are disposed so that no regions less than the half value are formed on the outside, when the brightness of LED 11 is the rated value. Thus, the LEDs 11 disposed along the resin frame 22 is disposed so that no regions less than the half value are formed between the LEDs and the resin frame 22. In the exemplary embodiment shown in FIG. 13, the brightness of LED 11 is 20000 [cd/m2]. It is preferable that the LEDs 11 disposed along the resin frame 22 are disposed so that the outer ends of the overlapping regions among the LEDs 11 disposed adjacent along the resin frame 22 are disposed so as to contact with the inner edge of the resin frame 22, as indicated by arrow C in FIG. 13.

Although a part of the half value regions defined around LEDs 11 disposed along the resin frame 22 overlaps the resin frame 22, the half value regions defined around LED 11 disposed along the resin frame 22 are defined as substantially circular in the first requirement similar to other LEDs 11. Further, since the LEDs 11 disposed along the resin frame 22 are disposed so that no regions less than the half value are formed between the LEDs and the resin frame 22, the outer side of LED 11 disposed along the resin frame 22 is not object of the second requirement.

Figure 14A:
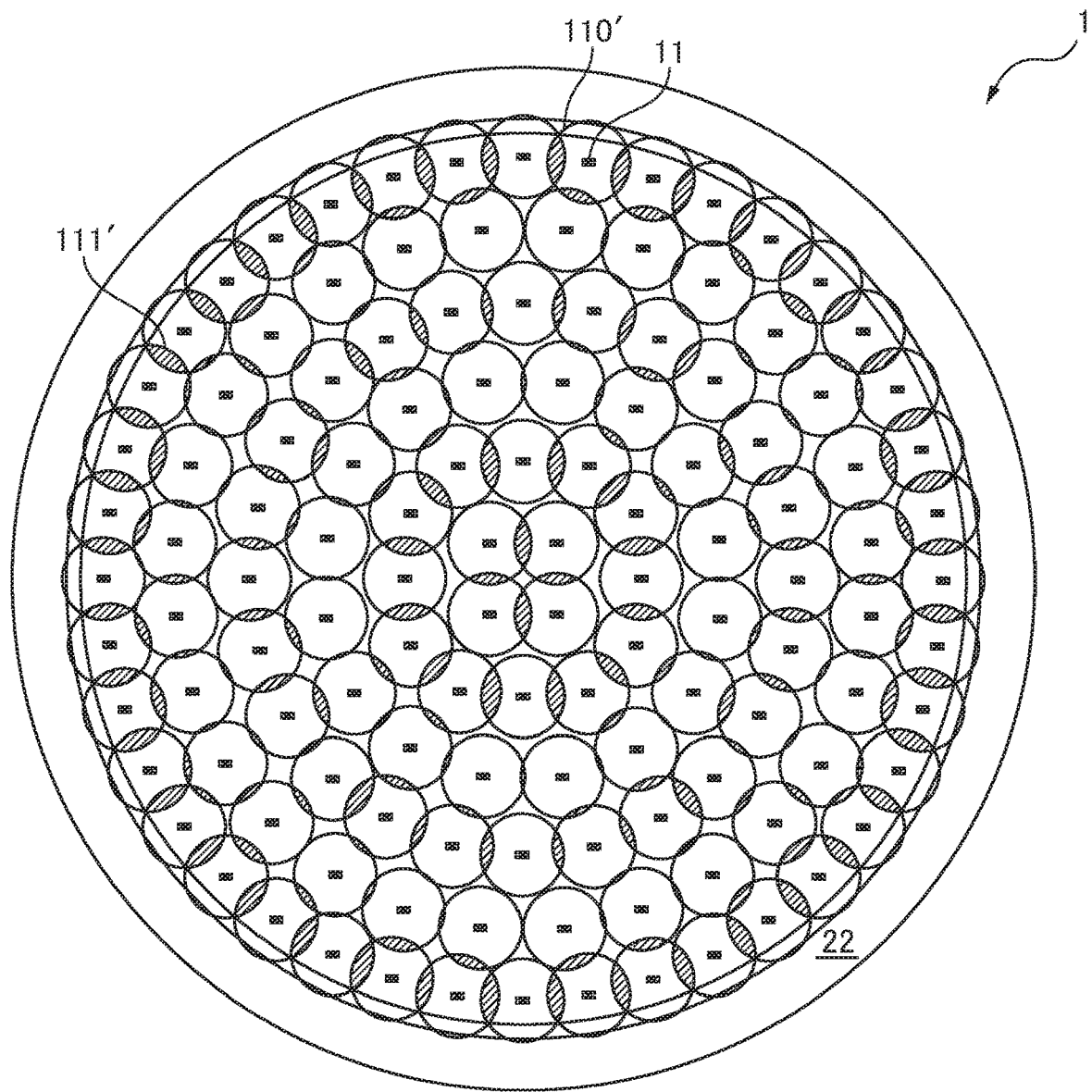
FIG. 14A is a figure showing a relationship between the LEDs and the first requirement according to the embodiment.
Figure 14B:
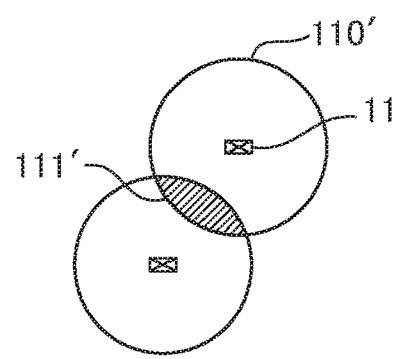
FIG. 14B is a partially enlarged view of a portion corresponding to the first requirement shown in FIG. 14A.

FIG. 14A is a figure showing a relationship between the LEDs 11 and the first requirement according to the embodiment, FIG. 14B is a partially enlarged view of a portion corresponding to the first requirement shown in FIG. 14A.

The first requirement indicates that an overlapping ratio (Alap/Ahalf) is 20% or less, wherein the overlapping ratio (Alap/Ahalf) is a ratio of an area Alap of an overlapping region 111 of LED 11 to an area Ahalf of the half value region the one of the plurality, and the overlapping region 111 is a region where a half value region 110' defined around one of the LEDs 11 overlaps that of an adjacent LED 11. In the LEDs 11 shown in FIG. 14B, the overlapping ratio (Alap/Ahalf) is 6.0%, and the mean of the overlapping ratio (Alap/Ahalf) of all of the LEDs 11 shown in FIG. 14A is 7.7%.

Figure 15A:
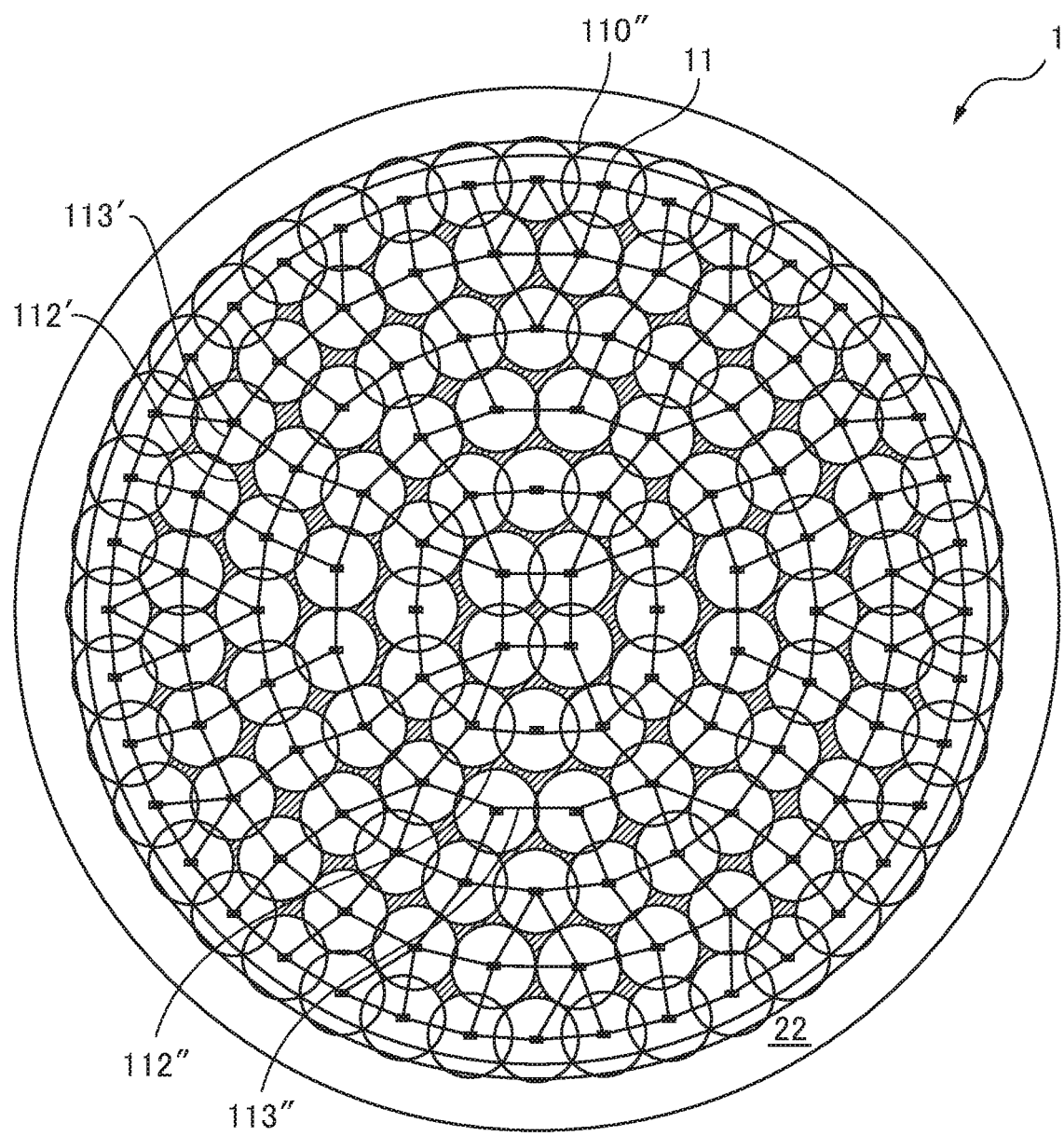
FIG. 15A is a figure showing a relationship between the LEDs and the second requirement according to the embodiment.
Figure 15B:
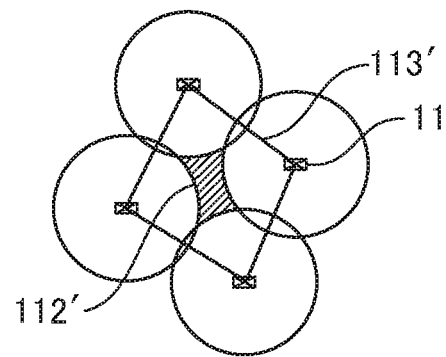
FIG. 15B is a partially enlarged view of a portion corresponding to the first example of the second requirement shown in FIG. 15A.
Figure 15C:
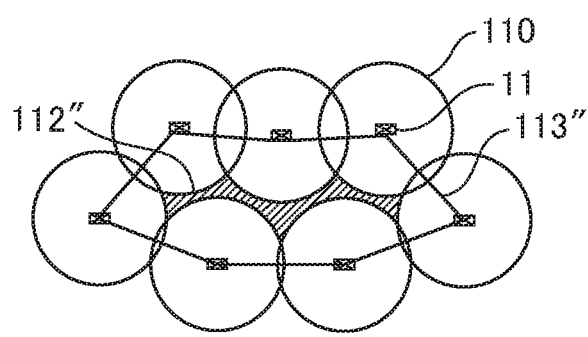
FIG. 15C is a partially enlarged view of a portion corresponding to the second example of the second requirement shown in FIG. 15A.

FIG. 15A is a figure showing a relationship between the LEDs 11 and the second requirement according to the embodiment. FIG. 15B is a partially enlarged view of a portion corresponding to the first example of the second requirement shown in FIG. 15A, and FIG. 15C is a partially enlarged view of a portion corresponding to the second example of the second requirement shown in FIG. 15A.

The second requirement indicates that a ratio less than the half value (Abelow/Aaround) is 20% or less, wherein the ratio less than the half value (Abelow/Aaround) is a ratio of an area Abelow of a region less than the half value to an area Aaround of a peripheral region formed by connecting among the plurality of LEDs disposed around the region less than the half value, and the region less than the half value is a region on which no half value regions 110' of the plurality of LEDs 11 are disposed. In the LEDs 11 of the first example shown in FIG. 15B, a region less than the half value 112' is a region where no half value region defined around the four LED 11 are disposed, and the surrounding region 113' is a region formed by connecting among the four LEDs 11 disposed around the region less than the half value 112'. In the LEDs 11 of the second example shown in FIG. 15C, a region less than the half value 112" is a region where no half value regions of the seven LEDs 11 are disposed, and a surrounding region 113" is a region formed by connecting among the seven LEDs 11 disposed around the regions less than the half value 112". In the LEDs 11 of the first example shown in FIG. 15B, the ratio less than the half value (Abelow/Aaround) is 12.6%, in the LEDs 11 of the second example shown in FIG. 15C, the ratio less than the half value (Abelow/Aaround) is 11.3%. Further, the mean value of the ratio less than the half value (Abelow/Aaround) of all of the LEDs 11 shown in FIG. 15A is 11.7%.

What is claimed is:

1. A backlight device comprising:
   a substrate;
   a plurality of light emitting elements disposed on a surface of the substrate;
   a diffuser plate having an incident surface disposed facing to the surface of the substrate, and an emitting surface disposed on an opposite side of the incident surface, diffuses light incident on the incident surface from the plurality of light emitting elements, and emits the diffused light from the emitting surface;
   a frame defining a light emitting region on which the plurality of light emitting elements are disposed; and
   a reflective sheet positioned between adjacent light emitting elements of the light emitting elements and disposed on the surface of the substrate apart from the adjacent light emitting elements,
   wherein a half value region is defined in which light that is equal to or more than half of a peak value of a brightness of light emitted from one of the plurality of light emitting elements is incident on the incident surface,
   wherein all of the plurality of light emitting elements disposed on the light emitting region are disposed so that an overlapping ratio is 20% or less,
   wherein the overlapping ratio is a ratio of an area of an overlapping region to the area of the half value region defined around the one of the light emitting elements, and the overlapping region is a region overlapping the half value region defined around the one of the light emitting elements and a half value region defined around another one of the light emitting elements adjacent to the one of the light emitting elements, and
   wherein, in a top view, the reflective sheet is arranged inside an outer line of the substrate, and the reflective sheet is arranged one-to-one with the substrate.

2. The backlight device according to claim 1, further comprising a plurality of reflection members disposed on portions of the incident surface respectively facing the plurality of light emitting elements so as to reflect light emitted from the light emitting element.

3. The backlight device according to claim 1, wherein all of the light emitting elements disposed along the frame are disposed so that the overlapping regions are formed among the adjacent light emitting elements disposed along the frame.

4. The backlight device according to claim 1, wherein the frame is disposed so as not to form a region less than the half value outside the light emitting elements disposed along the frame,
   wherein the region less than the half value is a region where the half value region is not disposed,
   wherein all of the plurality of light emitting elements are disposed so that a ratio less than the half value is 20% or less, wherein the ratio less than the half value is a ratio of an area of the region less than the half value to an area of a surrounding region formed by connecting at least three light emitting elements disposed around the region less than the half value, and wherein the region less than the half value is a region on which no half value regions of the plurality of light emitting elements are disposed.

5. The backlight device according to claim 1, wherein each of the plurality of light emitting elements are disposed so that three light emitting elements adjacent to each other are not aligned in a straight line.

6. A backlight device comprising:
a substrate;
a plurality of light emitting elements disposed on a surface of the substrate;
a diffuser plate having an incident surface disposed facing to the surface of the substrate, and an emitting surface disposed on an opposite side of the incident surface, diffuses light incident on the incident surface from the plurality of light emitting elements, and emits the diffused light from the emitting surface;
a frame defining a light emitting region on which the plurality of light emitting elements are disposed; and
a reflective sheet positioned between adjacent light emitting elements of the light emitting elements and disposed on the surface of the substrate apart from the adjacent light emitting elements,
wherein the frame is disposed so as not to form a region less than a half value outside the light emitting elements disposed along the frame,
wherein the region less than the half value is a region where a half value region is not disposed,
wherein all of the plurality of light emitting elements are disposed so that a ratio less than the half value is 20% or less,
wherein the ratio less than the half value is a ratio of an area of the region less than the half value to an area of a surrounding region formed by connecting at least three light emitting elements disposed around the region less than the half value,
wherein the region less than the half value is a region on which no half value regions of the plurality of light emitting elements are disposed, and
wherein, in a top view, the reflective sheet is arranged inside an outer line of the substrate, and the reflective sheet is arranged one-to-one with the substrate.

* * * * *